United States Patent [19]
Lin

[11] Patent Number: 6,121,626
[45] Date of Patent: Sep. 19, 2000

[54] METHOD AND SYSTEM OF EXPOSURE WITH A UNIVERSAL DYNAMIC MASK AND CHARGE COUPLED DEVICE IMAGE FEEDBACK CONTROL

[75] Inventor: Chin-Hsiang Lin, Kaohsung, Taiwan

[73] Assignee: Vanguard International Semiconductor Corporation, Hsin-Chu, Taiwan

[21] Appl. No.: 09/156,057

[22] Filed: Sep. 17, 1998

[51] Int. Cl.[7] .................................................. G01N 21/86
[52] U.S. Cl. .......................................... 250/548; 356/400
[58] Field of Search .................................. 250/548, 216, 250/208.1, 559.4, 559.44; 356/399–402; 355/53–55

[56] References Cited

U.S. PATENT DOCUMENTS

| | | | |
|---|---|---|---|
| 3,824,604 | 7/1974 | Stein | 354/5 |
| 4,846,694 | 7/1989 | Erhardt | 434/365 |
| 5,028,939 | 7/1991 | Hornbeck et al. | 346/160 |
| 5,083,854 | 1/1992 | Zampolin et al. | 359/40 |
| 5,461,475 | 10/1995 | Lerner et al. | 356/300 |
| 5,576,562 | 11/1996 | Konuma | 257/232 |
| 5,629,113 | 5/1997 | Watanabe | 430/5 |
| 5,701,185 | 12/1997 | Reiss et al. | 358/471 |

OTHER PUBLICATIONS

Pfauler et al. "High–Throughput Optical Direct Write Lithography" Solid State Technology (Jun. 1997), pp. 175–176, 178, 180, 182.

*Primary Examiner*—Que T. Le
*Attorney, Agent, or Firm*—George O. Saile; Stephen B. Ackerman; Graham S. Jones, II

[57] ABSTRACT

A dynamic mask exposure system and method includes a support for a workpiece, a source of a beam of exposure radiation, and a transmissive dynamic mask with orthogonally arranged matrices of actuator lines and binary pixel units which are opaque or transparent as a function of control inputs to the actuator lines, the transmissive dynamic mask having a top surface and a bottom surface. A control system is connected to supply pixel control signals to the actuator lines of the transmissive dynamic mask to form a pattern of transparent regions and opaque regions. The beam is directed down onto the top surface of the mask. A workpiece and/or an image detection element for detecting a pattern of radiation projected thereon is located on the top surface of the support. The beam passes through the transparent regions and projecting a pattern from the mask onto the support where the workpiece or onto the image detection element is to be located. In the case where the image detection element is the target, there are means for providing signals representing the pattern to the control system.

36 Claims, 3 Drawing Sheets

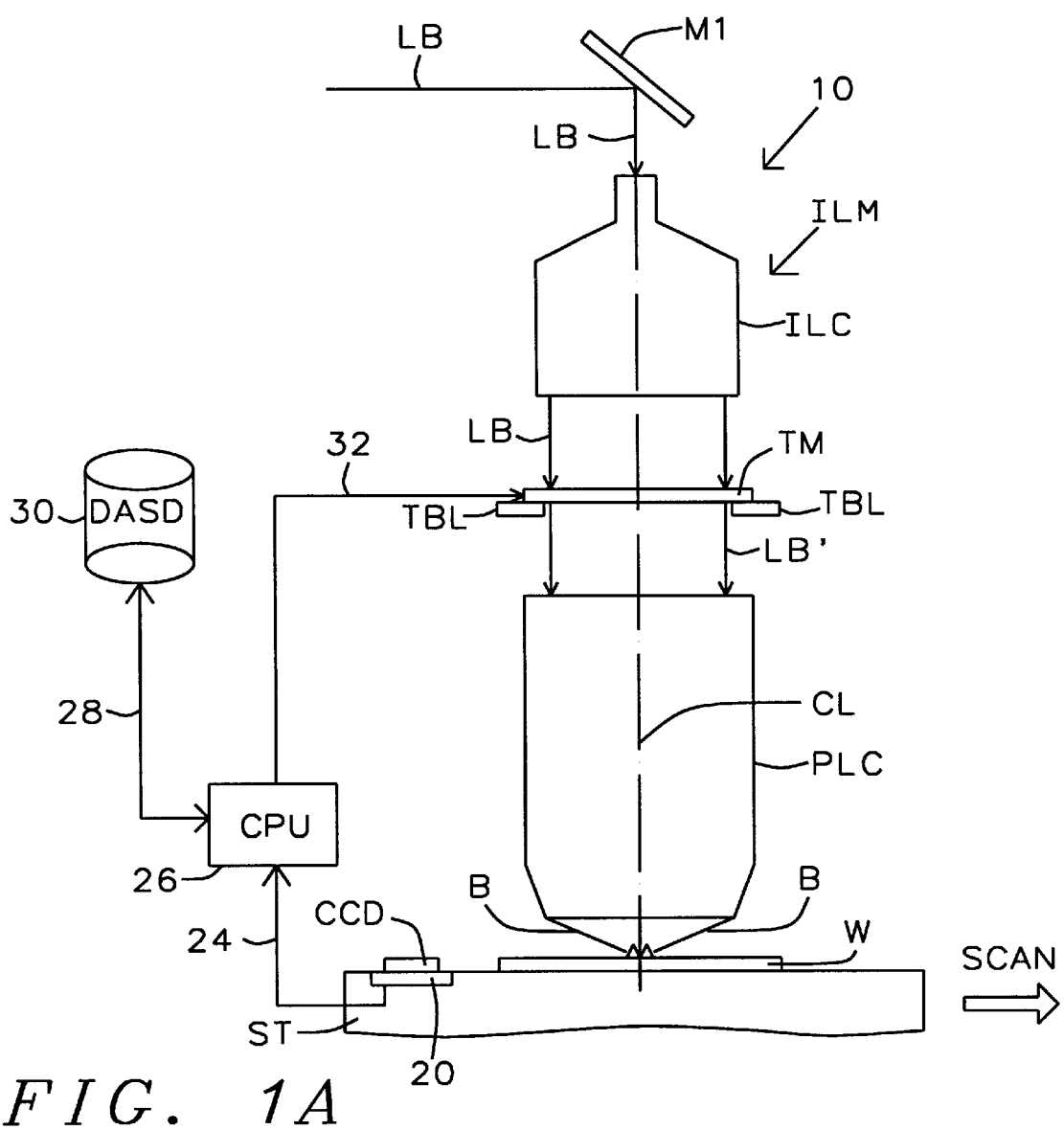
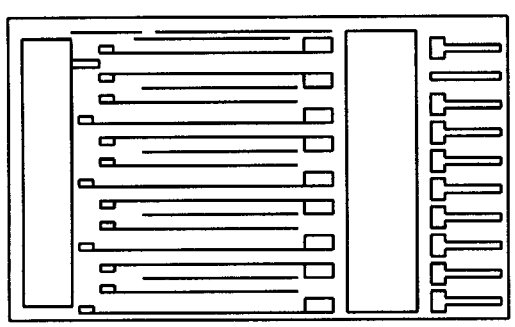
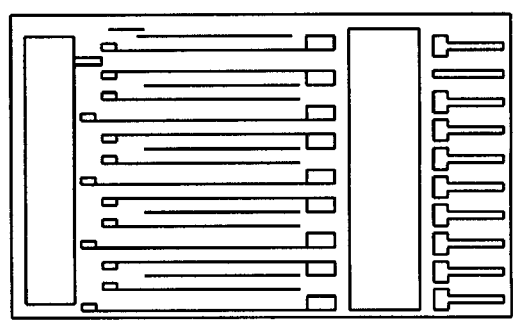
FIG. 1A
FIG. 1B
FIG. 1C

METHOD AND SYSTEM OF EXPOSURE WITH A UNIVERSAL DYNAMIC MASK AND CHARGE COUPLED DEVICE IMAGE FEEDBACK CONTROL

BACKGROUND OF THE INVENTION

1. Field of the Invention

This invention relates to exposure systems and more particularly to methods and apparatus for exposing a workpiece to radiation defining a pattern.

2. Description of Related Art

Disadvantages of comparable prior art are that a conventional stepper uses a fixed chromium (Cr) pattern binary mask. A mask which is both defect free and which has the exact Critical Dimension (CD) is very difficult to make. To produce one chip, normally many masks are needed for the required layers. For optimization of the photolithographic process employed, a few modifications of the mask at different time are required. In addition, many wafers require optimization of stepper parameters such as focus, energy, NA (Numerical Aperture), and dose.

Pfauler et al. "High-Throughput Optical Direct Write Lithography", Solid State Technology (June 1997), pp. 175–176, 178, 180, 182 describes a direct write lithography system using a programmable phase-modulated spatial light modulator (SLM) system in which the image is reflected from the SLM onto a semiconductor wafer. The spatial light modulator comprises an array of rectangular electrodes with a reflective, deformable viscoelastic layer on top. The SLM serves as a plane mirror in an optical system.

U.S. Pat. No. 5,701,185 of Reiss et al. for "Spatial Light Modulator Assembly for Adapting a Photographic Printer to Print Electronic Images" shows use of a SLM for a photographic printer.

U.S. Pat. No. 4,846,694 of Erhardt for "Computer Controlled Overhead Projector Display" in which a computer controls a transmissive (transparent or semi-transparent) liquid crystal display overhead projector display.

U.S. Pat. No. 3,824,604 of Stein for "Alphanumeric Printing System Employing Liquid Crystal Matrix" shows a printing system using a LCD matrix.

U.S. Pat. No. 5,028,939 of Hornbeck for "Spatial Light Modulator System" shows a SLM.

U.S. Pat. No. 5,083,854 of Zampolin et al. for "Spatial Light Modulator with Improved Aperture Ratio" shows a SLM with improved aperture ratio.

U.S. Pat. No. 5,576,562 of Komuma for "Solid-State Imaging Device" shows an imaging device using photodetectors arranged in a matrix array and a CCD.

U.S. Pat. No. 5,629,113 of Watanabe for "Photomask Used by Photolithography and a Process of Producing Same" shows a photomask and process for making the photomask.

SUMMARY OF THE INVENTION

A dynamic mask exposure system (and a corresponding method) includes a support for a workpiece, a source of a beam of exposure radiation, and a transmissive dynamic mask with orthogonally arranged matrices of actuator lines and binary pixel units which are opaque or transparent as a function of control inputs to the actuator lines, the transmissive dynamic mask having a top surface and a bottom surface. A control system is connected to supply pixel control signals to the actuator lines of the transmissive dynamic mask to form a pattern of transparent regions and opaque regions. The beam is directed down onto the top surface of the mask. A workpiece or an image detection element for detecting a pattern of radiation projected thereon is located on the top surface of the support. The beam passes through the transparent regions and projecting a pattern from the mask onto the support where the workpiece or onto the image detection element is to be located. In the case where the image detection element is the target, there are means for providing signals representing the pattern to the control system.

Preferably, the control system comprises a computer and a direct access storage device for storing patterning data.

Preferably, the transmissive dynamic mask comprises a transmissive spatial light modulator.

Preferably, the source of the beam of exposure radiation comprises a collimated beam of light.

Preferably the collimated beam of light is provided by a set of condenser lenses projecting the collimated beam of light onto the top surface of the mask.

Preferably the transmissive dynamic mask comprises a transmissive spatial light modulator.

Preferably a set of projection condenser lenses projects and focuses the pattern from the mask onto the support from the bottom surface of the mask.

BRIEF DESCRIPTION OF THE DRAWINGS

The foregoing and other aspects and advantages of this invention are explained and described below with reference to the accompanying drawings, in which:

FIG. 1A shows a schematic elevational section of a system for exposing a workpiece with a computer controlled pattern of light projected through a transmissive universal dynamic mask in accordance with this invention.

FIG. 1B shows a plan view of a pattern provided to transmissive universal dynamic mask in FIG. 1A in response to signals provided by a computer system.

FIG. 1C shows a plan view of a pattern provided by a CCD sensor in response to the image detected from the beam projected on the CCD with the patterns provided thereto by transmissive universal dynamic mask, providing feedback data to the control computer.

DESCRIPTION OF THE PREFERRED EMBODIMENT

FIG. 1A shows a schematic elevational section of a system 10 for exposing a workpiece with a pattern of light projected through a transmissive universal dynamic mask TM in accordance with this invention. FIG. 1A is a schematic elevational section of a system 10 taken along the x (horizontal from left to right) and z (vertical) axes (in an x, y, z coordinate system) of an exposure system 10 in accordance with this invention. A transmissive universal dynamic mask TM is supported in a fixed position on table TBL. The system 10 exposes a workpiece W supported by a stage ST with light projected through the mask TM. Mask TM is energized by x, y matrices as illustrated by FIG. 2 which is a plan view of the mask TM and the control system including computer 26 which energizes the pixel elements of the mask TM. Thus workpiece W is exposed to a pattern provided by mask TM under control of computer 26.

Figure 1D:
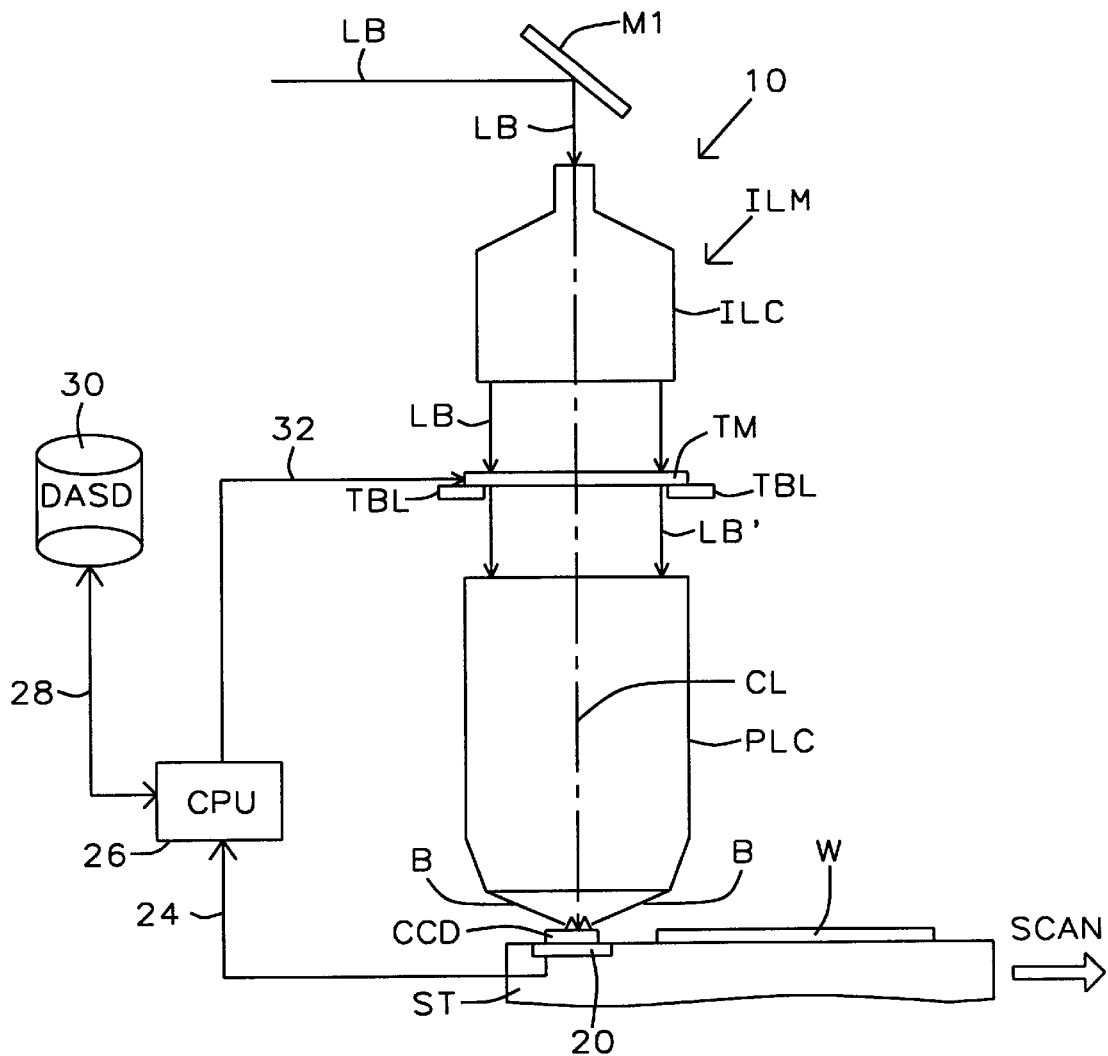
FIG. 1D shows how system performance is monitored by use of feedback from a charge coupled device image sensor which supplies the detected image data from the beam.
Figure 2:
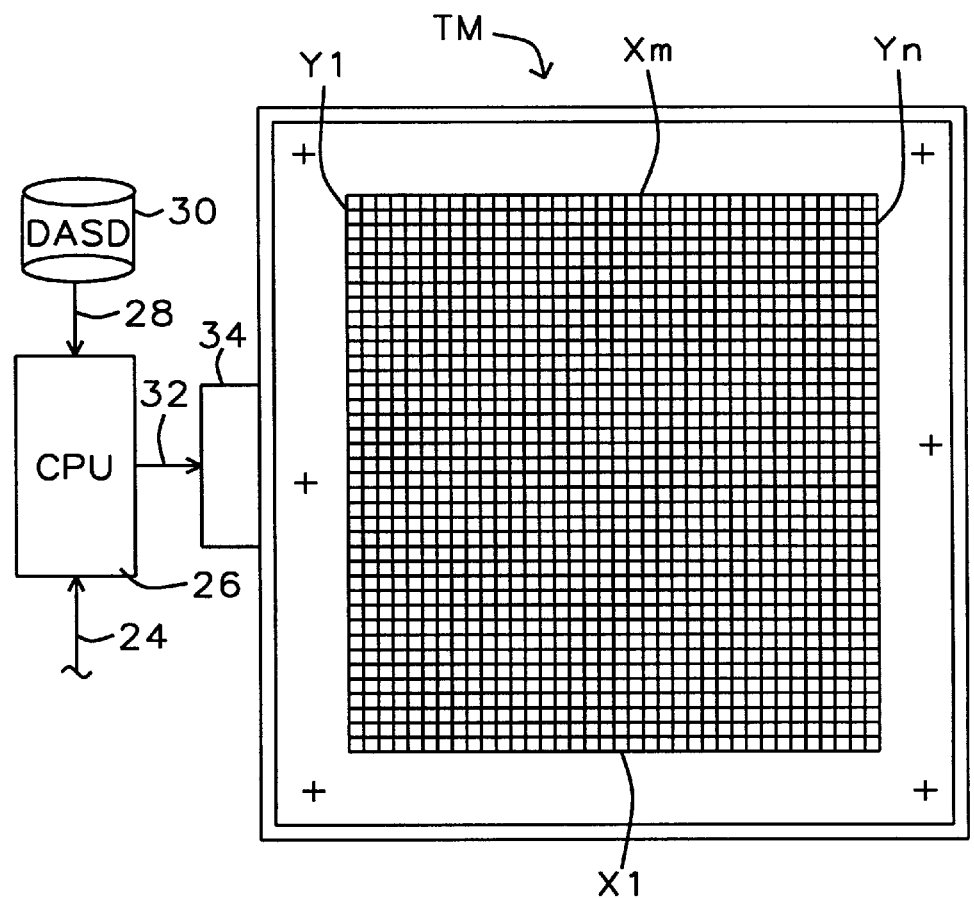
FIG. 2 shows a plan view of the transmissive universal dynamic mask TM shown in consisting of a x, y matrix array of small pixels which preferably comprises a spatial light modulator (SLM).

FIG. 1D shows how performance of the system 10 is monitored by use of feedback from a charge coupled device (CCD) image sensor 20 which supplies the detected image data from the beam B.

FIG. 2 shows a plan view of the transmissive universal dynamic mask TM shown in consisting of an x, y matrix array of small pixels which preferably comprises a spatial light modulator (SLM). Every pixel can be switched ON/OFF ("0"/"1") by a Central Processing Unit (CPU) of computer 26 to form a designed device pattern from a computer data base stored on data storage device 30 such as a disk drive or other Direct Access Storage Device (DASD). The computer 26 is connected by conventional interconnnection block 34 to the mask TM which comprises an array of actuator lines extending along rectilinear x and y coordinate axes. The x lines X1 to Xm extend horizontally parallel to the x axis and the y lines Y1 to Yn extend vertically parallel to the y axis, where "m" and "n" are positive integers equal to the number of parallel actuator lines in the array with m horizontal lines X1 . . . Xm and n vertical lines Y1 . . . Yn.

FIG. 1B shows a plan view of a pattern provided to transmissive universal dynamic mask TM in FIG. 1A in response to signals provided by computer 26 from data in DASD 30, as will be explained in more detail below.

FIG. 1C shows a plan view of a pattern provided by the CCD 20 in response to the image detected from the beam B projected on CCD 20 with the patterns provided thereto by transmissive universal dynamic mask TM. The CCD 20 provides feedback data to computer 26 as will be explained in more detail below. Ideally, the view seen in FIG. 1B should be identical to the view seen in FIG. 1C but a difference is very likely to occur since the view seen in FIG. 1B is the view of the image from the DASD 30 which is sent through computer 16 on lines 32 to the mask TM.

On the other hand, the view seen in FIG. 1C is the pattern detected by the CCD device 20 when the beam B is hitting the CCD device 20 as shown in FIG. 1D where the stage has moved far to the right side of the system 10 providing the ideal identical pattern shown in FIG. 1C.

A beam LB from a light source (not shown) is directed at a mirror M1 which reflects the beam LB from a light source down along a path parallel to the vertical z axis into a conventional illuminator lens module ILM. Module ILM includes an illumination lens column ILC which comprises a set of illuminator lenses which produce a collimated beam (i.e. parallel beam) of light rays directed towards mask TM through which a portion LB' of the beam LB passes in accordance with the pattern of the mask TM. Beam LB floods the upper surface of the mask TM which is supported in a fixed position on table TBL. Table TBL has a hollow opening below the central patterning portion of mask TM through which the beam LB' passes.

The workpiece W preferably comprises a silicon semiconductor wafer coated with a photoresist layer which is to be exposed to a pattern comprising the image projected through mask TM. That pattern is projected as a collimated beam LB through the currently transparent portions of the mask TM. Thus, portions of the collimated beam LB pass through the mask TM, where the mask TM is transmissive, (not where it is opaque) thereby projecting an image defined by mask TM and patterned in light beam LB' onto workpiece W.

Transmissive universal dynamic mask TM preferably comprises a transmissive Spatial Light Modulator (SLM) with an array of pixels each of which is opaque or transparent respectively in accordance whit the x, y matrix binary signals provided from CPU 26 on line 32 to the mask TM. The CPU 26 controls every pixel to be "ON" or "OFF".

Every pixel of the matrix of mask TM is switched ON (light: "1") or OFF (dark: "0") in response to signals on x and y matrix lines. The binary ON/OFF ("1"/"0") signals provide transmissive or opaque regions in the matrix through which beam LB is projected using a transmissive universal dynamic mask TM formed for example by a Spatial Light Modulator (SLM).

A circuit layout made by a designer and stored in disk drive storage device 20 is transferred from computer (CPU) 26 into the control lines 34 of the transmissive universal dynamic mask TM by appropriately turning the pixels "ON" and/or "OFF" in the appropriate locations to form each pattern desired as a function of time as different workpieces are loaded on the stage ST.

As stated above, patterning images provided by the transmissive mask TM are generated under control of a computer CPU 26 which energizes elements of the transmissive universal dynamic mask TM. Computer CPU 26 receives x, y matrix patterning data on line 28 from direct access storage device (DASD) 30, such as a disk drive, where the pattern data is stored. The CPU 26 also sends data on line 28 for storage in DASD 30, as is well understood by those skilled in the art.

After the light beam LB is projected through mask TM where it is converted into beam LB', beam LB' passes through a conventional projection lens column PLC to expose workpiece W projecting the patterning images received in the beam B from the transmissive mask TM onto the work W.

In other words the patterning images comprise portions of beam LB which pass through the mask TM as beam LB' and which then pass down through a conventional projection lens column PLC which receives the beam LB' after it passes through the mask TM. The projection lens column PLC comprises a set of lenses, including, for example, a set of condenser lenses. The projection lenses in column PLC maintains the collimated beam LB' of light rays directed along centerline CL towards the workpiece W. The lenses in column PLC focus the beam LB' into a beam B which exposes the surface of the workpiece W with the pattern projected from the mask TM above to expose the photoresist upon the surface of the workpiece W with the pattern projected from the mask TM.

A CCD imager on wafer stage responds to the exposed pattern transferred from the mask/projection lens. The charge coupled device CCD produces an image which is transmitted into the CPU 26 (computer) and compared to the designed pattern in the data base stored in the data storage device 30. These CCD image results are analyzed to optimize and modify the pattern on mask TM. The CCD imager also assists the optimizations of focus, dose, Numerical Aperture and partial coherence setting.

FIG. 2 shows a transmissive universal dynamic mask TM which has a range from about 0.1 to about 3 $\mu \rightarrow$ from about 50% to about 95% light transmission.

When a different layer is exposed, it is not necessary to reload the mask TM mechanically, only load the device/layer file through the CPU to the mask TM.

The whole device uses the same physical mask TM (fixed pixel) and there is no mechanical movement of the mask TM, which will improve the overlay (layer to layer) dramatically.

This significantly reduces the mask set required.

| DATA BASE | |
|---|---|
| Device A | Device B |
| Layer 1 | Layer 1 |
| Layer 2 | Layer 2 |
| Layer 3 | Layer 3 |
| Layer 4 | Layer 4 |

Figure 3:
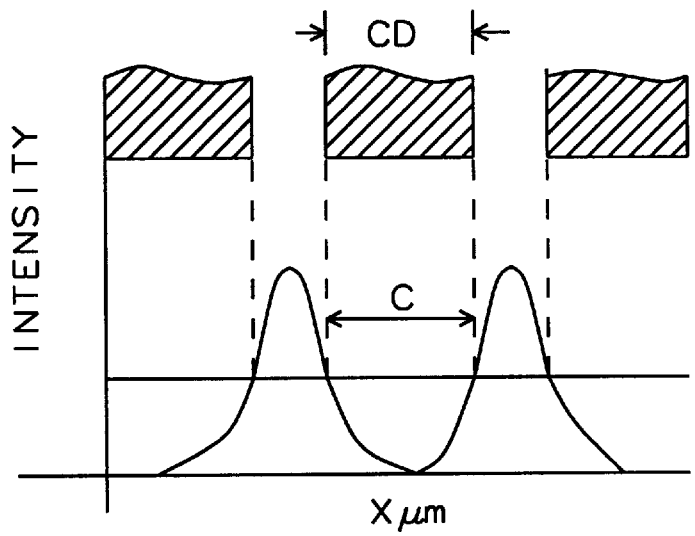
FIG. 3 which shows a graph for a CCD aerial image of Intensity as a function of distance x in micrometers.

1. A CCD image (aerial image) is compared to real processed wafer CD to calibrate the CCD image Critical Dimension (CD), to fix the threshold of the aerial image as shown in FIG. 3 which shows a graph for the CCD aerial image of Intensity as a function of distance x in micrometers. C is the desired pattern CD on wafers, (intensity threshold is determined by experimental data.)
2. Then the CCD image of the CD will also be compared to the data-Base patterns to determine the CD variations and distortion on the CCD image.
3. Then the system in computer 26 corrects the CD and distortion on the dynamic mask TM.
4. Using this CCD image, one can set criteria to determine an optimum focus of the lens module and optimum stage levelling of the exposure tool ET of FIG. 1.
5. One can also change the focus and exposure dose, then check the CCD image/data-Base pattern mapping result, followed by feeding back to the CPU to determine the best NA (Numerical Aperture) and partial coherence of lens parameters to give the best setting for obtaining the largest depth of focus and energy latitude.

In summary, the invention teaches a mask system comprising (a) a transmissive universal dynamic mask TM (e.g., A Spatial Light Modulator (SLM) assembly—and (b) a CCD image feedback to a computer.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. A dynamic mask exposure system comprising:

a support for a workpiece, a source of a beam of exposure radiation, a transmissive dynamic mask with orthogonally arranged matrices of actuator lines and binary pixel units which are opaque or transparent as a function of control inputs to the actuator lines, the transmissive dynamic mask having a top surface and a bottom surface, a control system connected to supply pixel control signals to the actuator lines of the transmissive dynamic mask to form a pattern of transparent regions and opaque regions, the beam directed down onto the top surface of the mask, and the beam passing through the transparent regions and projecting a pattern from the mask onto the support where the workpiece is to be located.

2. A dynamic mask exposure system in accordance with claim 1 wherein:

the control system comprises a computer and a direct access storage device for storing patterning data.

3. A dynamic mask exposure system in accordance with claim 1 wherein:

the transmissive dynamic mask comprises a transmissive spatial light modulator.

4. A dynamic mask exposure system in accordance with claim 1 wherein:

the control system comprises a computer and a direct access storage device for storing patterning data, and the transmissive dynamic mask comprises a transmissive spatial light modulator.

5. A dynamic mask exposure system in accordance with claim 1 wherein:

the source of the beam of exposure radiation comprises a collimated beam of light.

6. A dynamic mask exposure system in accordance with claim 1 wherein:

the source of the beam of exposure radiation comprises a collimated beam of light provided by a set of lenses projecting the collimated beam of light onto the top surface of the mask.

7. A dynamic mask exposure system in accordance with claim 1 wherein:

the control system comprises a computer and a direct access storage device for storing patterning data, and the transmissive dynamic mask comprises a transmissive spatial light modulator.

8. A dynamic mask exposure system in accordance with claim 1 wherein:

the source of the beam of exposure radiation comprises a collimated beam of light provided by a set of condenser lenses projecting the collimated beam of light onto the top surface of the mask, and a set of projection lenses projecting and focussing the pattern from the mask onto the support from the bottom surface of the mask.

9. A dynamic mask exposure system in accordance with claim 8 wherein:

the control system comprises a computer and a direct access storage device for storing patterning data, and the transmissive dynamic mask comprises a transmissive spatial light modulator.

10. A dynamic mask exposure system comprising:

a support for a workpiece, a source of a beam of exposure radiation, a transmissive dynamic mask with orthogonally arranged matrices of actuator lines and binary pixel units which are opaque or transparent as a function of control inputs to the actuator lines, the transmissive dynamic mask having a top surface and a bottom surface, a control system connected to supply pixel control signals to the actuator lines of the transmissive dynamic mask to form a pattern of transparent regions and opaque regions, the beam directed down onto the top surface of the mask, an image detection element for detecting a pattern of radiation projected thereon located on the top surface of the support, the beam passing through the transparent regions and projecting a pattern from the mask onto the support where the image detection element is to be located, and means for providing signals representing the pattern to the control system.

11. A dynamic mask exposure system in accordance with claim 10 wherein:

the control system comprises a computer and a direct access storage device for storing patterning data.

12. A dynamic mask exposure system in accordance with claim 10 wherein:

the transmissive dynamic mask comprises a transmissive spatial light modulator.

13. A dynamic mask exposure system in accordance with claim 10 wherein:

the control system comprises a computer and a direct access storage device for storing patterning data, and the transmissive dynamic mask comprises a transmissive spatial light modulator.

14. A dynamic mask exposure system in accordance with claim 10 wherein:

the source of the beam of exposure radiation comprises a collimated beam of light.

15. A dynamic mask exposure system in accordance with claim 10 wherein:

the source of the beam of exposure radiation comprises a collimated beam of light provided by a set of lenses projecting the collimated beam of light onto the top surface of the mask.

16. A dynamic mask exposure system in accordance with claim 10 wherein:

the control system comprises a computer and a direct access storage device for storing patterning data, and the transmissive dynamic mask comprises a transmissive spatial light modulator.

17. A dynamic mask exposure system in accordance with claim 10 wherein:

the source of the beam of exposure radiation comprises a collimated beam of light provided by a set of lenses projecting the collimated beam of light onto the top surface of the mask, and a set of projection lenses projecting and focussing the pattern from the mask onto the support from the bottom surface of the mask.

18. A dynamic mask exposure system in accordance with claim 17 wherein:

the control system comprises a computer and a direct access storage device for storing patterning data, and the transmissive dynamic mask comprises a transmissive spatial light modulator.

19. A dynamic mask exposure method comprising:

providing a support for a workpiece, providing a source of a beam of exposure radiation, providing a transmissive dynamic mask with orthogonally arranged matrices of actuator lines and binary pixel units which are opaque or transparent as a function of control inputs to the actuator lines, the transmissive dynamic mask having a top surface and a bottom surface, supplying pixel control signals to the actuator lines of the transmissive dynamic mask to form a pattern of transparent regions and opaque regions, directing the beam down onto the top surface of the mask, and passing the beam through the transparent regions and projecting a pattern from the mask onto the support where the workpiece is to be located.

20. A dynamic mask exposure method in accordance with claim 19 wherein:

the control method comprises using a computer and a direct access storage device for storing patterning data.

21. A dynamic mask exposure method in accordance with claim 19 wherein:

the transmissive dynamic mask comprises a transmissive spatial light modulator.

22. A dynamic mask exposure method in accordance with claim 19 wherein:

the control method comprises using a computer and a direct access storage device for storing patterning data, and the transmissive dynamic mask comprises a transmissive spatial light modulator.

23. A dynamic mask exposure method in accordance with claim 19 wherein:

the source of the beam of exposure radiation comprises a collimated beam of light.

24. A dynamic mask exposure method in accordance with claim 19 wherein:

the source of the beam of exposure radiation comprises a collimated beam of light provided by a set of lenses projecting the collimated beam of light onto the top surface of the mask.

25. A dynamic mask exposure method in accordance with claim 19 wherein:

the control system comprises a computer and a direct access storage device for storing patterning data, and the transmissive dynamic mask comprises a transmissive spatial light modulator.

26. A dynamic mask exposure method in accordance with claim 19 wherein:

the source of the beam of exposure radiation comprises a collimated beam of light provided by a set of lenses projecting the collimated beam of light onto the top surface of the mask, and a set of projection lenses projecting and focussing the pattern from the mask onto the support from the bottom surface of the mask.

27. A dynamic mask exposure method in accordance with claim 26 wherein:

the control system comprises a computer and a direct access storage device for storing patterning data, and the transmissive dynamic mask comprises a transmissive spatial light modulator.

28. A dynamic mask exposure method comprising:

providing a support for a workpiece, providing a source of a beam of exposure radiation, providing a transmissive dynamic mask with orthogonally arranged matrices of actuator lines and binary pixel units which are opaque or transparent as a function of control inputs to the actuator lines, the transmissive dynamic mask having a top surface and a bottom surface, supplying pixel control signals to the actuator lines of the transmissive dynamic mask to form a pattern of transparent regions and opaque regions, directing the beam down onto the top surface of the mask, locating an image detection element for detecting a pattern of radiation projected thereon located on the top surface of the support, passing the beam through the transparent regions and projecting a pattern from the mask onto the support where the image detection element is located, and providing signals representing the pattern to the control system from the image detection element.

29. A dynamic mask exposure method in accordance with claim 28 wherein:

the control system comprises a computer and a direct access storage device for storing patterning data.

30. A dynamic mask exposure method in accordance with claim 28 wherein:

the transmissive dynamic mask comprises a transmissive spatial light modulator.

31. A dynamic mask exposure method in accordance with claim 28 wherein:

the control system comprises a computer and a direct access storage device for storing patterning data, and the transmissive dynamic mask comprises a transmissive spatial light modulator.

32. A dynamic mask exposure system in accordance with claim 28 wherein:

the source of the beam of exposure radiation comprises a collimated beam of light.

33. A dynamic mask exposure system in accordance with claim 28 wherein:

the source of the beam of exposure radiation comprises a collimated beam of light provided by a set of lenses projecting the collimated beam of light onto the top surface of the mask.

34. A dynamic mask exposure system in accordance with claim 28 wherein:

the control system comprises a computer and a direct access storage device for storing patterning data, and the transmissive dynamic mask comprises a transmissive spatial light modulator.

35. A dynamic mask exposure system in accordance with claim 28 wherein:

the source of the beam of exposure radiation comprises a collimated beam of light provided by a set of lenses projecting the collimated beam of light onto the top surface of the mask, and a set of projection lenses projecting and focussing the pattern from the mask onto the support from the bottom surface of the mask.

36. A dynamic mask exposure system in accordance with claim 35 wherein:

the control system comprises a computer and a direct access storage device for storing patterning data, and the transmissive dynamic mask comprises a transmissive spatial light modulator.

* * * * *